United States Patent
Wu et al.

(10) Patent No.: US 7,115,974 B2
(45) Date of Patent: Oct. 3, 2006

(54) SILICON OXYCARBIDE AND SILICON CARBONITRIDE BASED MATERIALS FOR MOS DEVICES

(75) Inventors: Zhen-Cheng Wu, Hsinchu (TW); Hung Chun Tsai, Hsinchu (TW); Da-Wen Lin, Taichung (TW); Weng Chang, Hsinchu (TW); Shwang-Ming Cheng, Hsinchu (TW); Mong Song Liang, Hsinchu (TW)

(73) Assignee: Taiwan Semiconductor Manfacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/895,514

(22) Filed: Jul. 21, 2004

(65) Prior Publication Data

US 2005/0236694 A1  Oct. 27, 2005

Related U.S. Application Data

(60) Provisional application No. 60/565,630, filed on Apr. 27, 2004.

(51) Int. Cl.
*H01L 23/58* (2006.01)
(52) U.S. Cl. ............... 257/649; 257/325; 257/411; 257/632; 257/639; 257/760
(58) Field of Classification Search ............. None
See application file for complete search history.

(56) References Cited

U.S. PATENT DOCUMENTS 6,127,262 A   10/2000  Huang et al.
6,209,484 B1   4/2001  Huang et al.
6,277,764 B1 *  8/2001  Shin et al. ............ 438/763
6,861,686 B1 *  3/2005  Lee et al. ............. 257/291
2004/0124420 A1 *  7/2004  Lin et al. ............. 257/77

OTHER PUBLICATIONS

Maszara, W.P., et al., "SOI and Strain: CMOS Performance Enhancers," Solid State Technology, WaferNEWS, http://sst.pennnet.com/Articles/Article_Display.cfm?Section=ARTCL&ARTICLE_ID=182802&VERSION_NUM=1&p=5.

Rim, K., "Strained Silicon and SOI: Complementary Technologies," Solid State Technology, WaferNEWS, http://sst.pennnet.com/Articles/Article_Display.cfm?Section=ARTCL&ARTICLE_ID=182802&VERSION_NUM=1&p=5.

* cited by examiner

*Primary Examiner*—Nathan J. Flynn
*Assistant Examiner*—Scott R. Wilson
(74) *Attorney, Agent, or Firm*—Slater & Matsil, L.L.P.

(57) ABSTRACT

In the preferred embodiment, a gate dielectric and an electrode are formed on a substrate. A pair of spacers is formed along opposite sidewalls of the gate electrode and the gate dielectric. Spacers are preferably formed of SiCO based material or SiCN based material. The source and drain are then formed. A contact etch stop (CES) layer is formed on the source/drain regions and the spacers. The CES layer is preferably formed of SiCO based material or SiCN based material. An Inter-Level Dielectric (ILD) is then formed on the CES layer.

19 Claims, 6 Drawing Sheets

SILICON OXYCARBIDE AND SILICON CARBONITRIDE BASED MATERIALS FOR MOS DEVICES

This applications claims priority to provisional patent application Ser. No. 60/565,630, filed Apr. 27, 2004, and entitled "Silicon Oxycarbide and Silicon Carbonitride Based Materials for MOS Devices," which application is incorporated herein by reference.

FIELD OF INVENTION

This invention relates generally to semiconductor devices, and more specifically to contact etch stop layers.

BACKGROUND

In deep sub micron microelectronic manufacturing, silicon nitride films are widely employed as stop layers during contact etching. As is well known in the art, the inter-level dielectric (ILD) is formed to provide insulation between the MOS devices and overlying metal lines that will be formed subsequently. The contact openings are made through the ILD layer to the source, drain and gate. The ILD layer is relatively thick, and it is hard to control the etching process in order to not over etch. The contact etch stop layer is formed prior to the formation of the ILD layer. A first highly selective etching is conducted to etch the ILD layer and stop at the etch stop layer. A second selective etching is conducted to etch the stop layer so that the underlying layer is exposed.

The conventionally used silicon nitride etch stop layer has several disadvantages. It has a high dielectric constant value (also known as k value), typically about 7.5 to 8. The high k value increases high parasitic capacitance, which degrades the device performance. Additionally, the deposition rate of the silicon nitride film is low and the deposition temperature is high, which are not desirable process characteristics.

SUMMARY OF THE INVENTION

The preferred embodiments of the present invention use silicon oxycarbide (SiCO) (also called Silicon, Carbon containing based oxide) and silicon carbonitride (SiCN) (also called Silicon, Carbon containing based nitride) based materials, such as carbon doped oxide (CDO) and nitride doped silicon carbide (NDC) to make the contact etch stop layer.

The SiCO and SiCN based materials have lower k values than silicon nitride (SiN). In addition, they may be deposited at higher deposition rates and at lower deposition temperatures. By using the SiCO and SiCN based materials in the MOS device, the characteristics of the device such as the outer fringing capacitance, contact resistance, sheet resistance, threshold voltage, and leakage current are either improved or comparable to the prior art.

In the preferred embodiment, a gate dielectric and a gate electrode are formed on a substrate. A pair of spacers is formed along opposite sidewalls of the gate electrode and gate dielectric. The source and drain are formed. A contact etch stop (CES) layer is formed on the source/drain regions and spacers. The CES layer is preferably formed of SiCO based material or SiCN based material. An inter-level dielectric (ILD) is formed on the CES layer. The contact openings are then formed and contact plugs are formed in the contact openings.

SiCO and SiCN based materials may also be used to form other parts of the MOS device, such as spacers, gate step features and the ILD.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments of the present invention use silicon oxycarbide (SiCO) and silicon carbonitride (SiCN) based material, such as carbon-doped oxide (CDO) and nitride-doped silicon carbide (NDC) to make MOS devices. The details of making the preferred embodiments are discussed. The test results of the MOS devices are then discussed.

Figure 1:
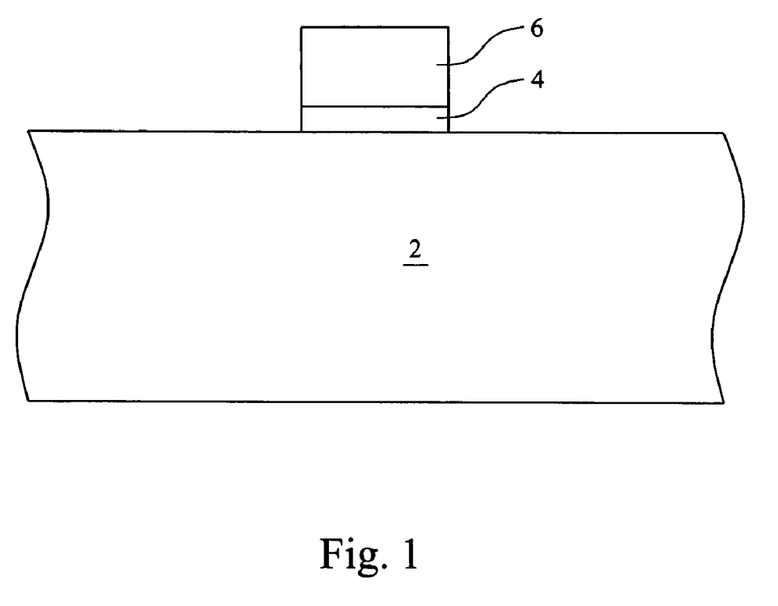
FIGS. 1 through 7 are cross-sectional views of intermediate stages in the manufacture of a preferred MOS transistor embodiment.

FIGS. 1 through 7 illustrate the preferred embodiments of the present invention. FIG. 1 illustrates the formation of a gate. In an illustrative embodiment, the substrate 2 is a silicon substrate. In other embodiments, silicon germanium (SiGe), bulk semiconductor, strained semiconductor, compound semiconductor, multi-layer semiconductor or silicon-on-insulator (SOI), strained silicon-on-insulator (SSOI), strained silicon germanium on insulator (S—SiGeOI), silicon germanium on insulator (SiGeOI), germanium on insulator (GeOI) and similar materials can be used as the substrate 2. As is known in the art, portions of the substrate, such as channel areas, will be lightly doped with n or p type dopant.

A gate dielectric 4 is deposited on the surface of substrate 2. The gate dielectric may preferably be oxide. The forming method can be any of the known methods, such as local oxidation of silicon (LOCOS), chemical vapor deposition (CVD), etc. In another embodiment, silicon nitride is used since it is an effective barrier to impurity diffusion. The silicon nitride film is preferably formed by thermal nitridation of silicon. It can also be prepared by plasma anodic nitridation using nitrogen-hydrogen. The silicon nitride film may also be formed by thermal nitridation of $SiO_2$. In other embodiments, the gate dielectric may also be an oxy-nitride, an oxygen-containing dielectric, a nitrogen-containing dielectric or any combination thereof.

FIG. 1 also shows a gate electrode 6 formed on gate dielectric 4. Gate electrode 6 is preferably polysilicon, although it may be formed of metal, or a compound structure comprised of metal, semiconductor, metal oxide and silicide.

A preferred method of formation is chemical vapor deposition (CVD). The polysilicon has the ability of being used as a mask to achieve minimum gate-to-source/drain overlap. This in turn enhances the device performance. The polysilicon is then doped to reduce the sheet resistance. Other embodiments may use amorphous silicon, elemental metals that are conductive, alloys of elemental metals that are conductive, silicides or nitrides of elemental metals that are conductive or any combination thereof. The gate polysilicon 6 and gate dielectric 4 are patterned to form a gate.

Figure 2:
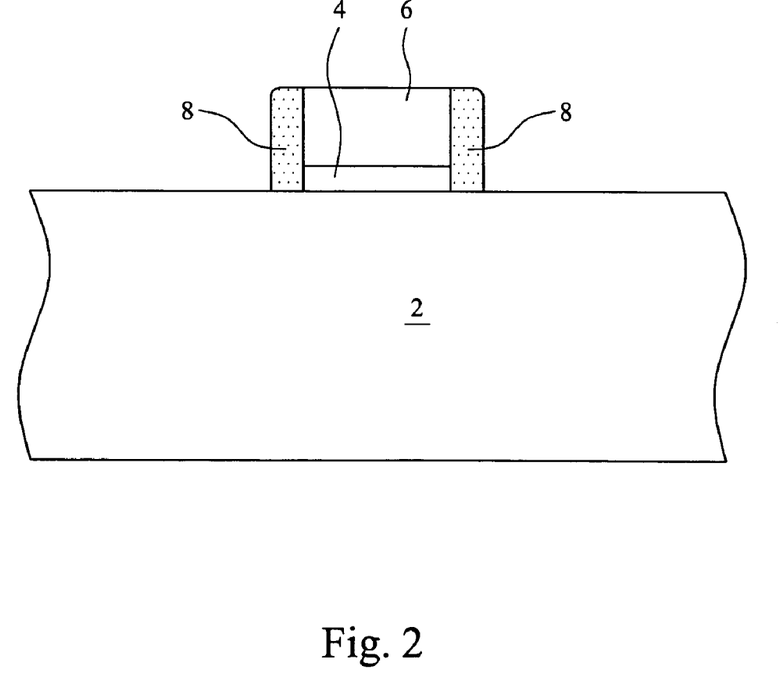

FIG. 2 illustrates a gate with spacers. A pair of spacers 8 is formed along the sidewalls of the gate dielectric 4 and gate electrode 6. Spacers 8 serve as self-aligning masks for a subsequent salicidation process, as described below. The spacer material can be oxide, silicon nitride, oxy-nitride or any combination thereof. The spacers 8 may be formed by well-known methods such as blanket depositing a dielectric layer over the entire region including substrate 2 and gate electrode 6, then anisotropically etching to remove the dielectric layer from horizontal surfaces and leaving the spacers 8.

In the preferred embodiment, the spacer material can be SiCO based, such as carbon-doped oxide (CDO), carbon incorporated silicon oxide (SiOC) or Ornithine decarboxylase (ODC). In another preferred embodiment, the spacer material can be SiCN based, such as nitrogen-doped silicon carbide (NDC). The details of forming the SiCO and SiCN based layer are provided below with the introduction of the formation of the CES. The k value of the SiCO and SiCN based material is preferably smaller than about 5.0. Since the typical integrated circuit size is decreasing, the typical distance between the contact plugs (i.e., the conductive contacts to the source and drain, respectively) and poly is also decreasing, so that the outer fringing capacitance (the capacitance between the gate poly and the source/drain) becomes more significant. The reduction of the k value helps the reduction of the outer fringing capacitance. Therefore, lower k value materials are preferred. In the preferred embodiment, when the spacer material is changed from silicon nitride, which has a k value of 7.5, to a SiCO or SiCN based material with a k value of 4.0, the outer fringing capacitance is reduced by about 4% to about 5%.

The SiCO and SiCN based materials are not limited to the spacers. If the gate structure of the device has a dielectric step feature that is either between one poly layer and another poly layer, or between a poly and a contact plug, then it is desirable that the step feature be made of SiCO or SiCN based materials. A step feature is a feature that rises above the silicon substrate. Preferably, SiCO and SiCN based materials may be used if the spacing between the spacers of the neighboring devices is smaller than about 300 Å, or the step feature has an aspect ratio (the ratio of step height to step length) larger than about 2, or the step height is larger than about 300 Å. In a typical case, a step feature may have a height of greater than about 1000 Å. Also when a CESL is deposited on polysilicon gates that do no have spacers formed, the CESL deposited at the sidewall of the poly becomes the step feature and SiCO and SiCN based materials are desired to be used as the CESL.

Figure 3:
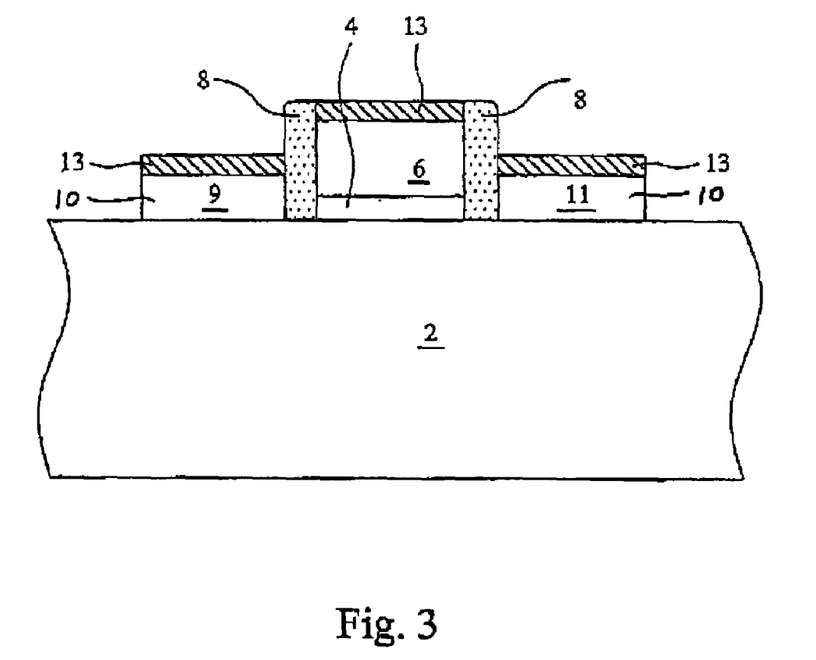

FIG. 3 illustrates the formation of the source and drain. A semiconductor material 10, which defines the regions of the source and drain, is epitaxially deposited. A preferred method of forming semiconductor material 10 is selective epitaxy. A $SiO_2$ layer (not shown) is formed to cover substrate 2. Openings are then formed through the $SiO_2$ to expose source/drain regions. Semiconductor material 10 is ten epitaxially grown. Semiconductor material 10 is preferably formed using molecular beam epitaxy (MBE), although other deposition techniques, including chemical vapor deposition (CVD), ultra high vacuum chemical vapor deposition (UHVCVD), atomic layer chemical vapor deposition (ALCVD) or metal organic chemical vapor deposition (MOCVD) can also be used. In the region where a single crystal substrate is exposed, semiconductor 10 is grown epitaxially. On the $SiO_2$ layer, a poly-crystal is formed. The poly-crystal and $SiO_2$ are then etched, leaving only semiconductor layer 10. Semiconductor material 10 forms source 9 and drain 11. In other embodiments, source 9 and drain 11 can be formed of materials that are epitaxially grown in recesses formed in substrate 2, in which case the source 9 and drain 11 are formed substantially within substrate 2 (as opposed to on substrate 2). In yet other embodiments, source 9 and drain 11 can be formed by doping select regions of substrate 2.

Gate electrode 6 and source 9 and drain 11 regions are then exposed to ion-implantation. It is desirable that the source 9 and drain 11 regions formed from semiconductor material 10 be highly doped with p or n type dopant. The resistivity of the polysilicon is reduced through doping. An annealing step is then performed to restore lattice structure to the pre-implanted state. The annealing process is carefully controlled. In one embodiment, the dopant is diffused vertically beyond the implant-damaged region. In another embodiment, a rapid thermal process (RTP) is adopted to minimize dopant redistribution. It is to be appreciated that lateral distribution may cause dopant to diffuse into the region under the spacers, but may not be diffused to the region under the gate dielectric.

Also shown in FIG. 3, silicide regions 13 are formed through a self-aligned silicide (salicide) process. The gate electrode and source and drain regions are coated with a transitional metal, such as Cobalt, Titanium, Nickel, or the like. In the preferred embodiment, Nickel is used. The device is then heated, which causes the metal to react with the underlying silicon and form a silicide. The un-reacted metal is selectively removed through the use of an etchant that does not attack the silicide, $SiO_2$ and silicon substrate, as is well known in the art.

Pretreatments may be optionally performed. An $H_2$ pretreatment may preferably be conducted in a chamber. One example of the treatment condition is: The $H_2$ flow rate is about 9500 sccm, the chamber pressure is kept at about 2.3 torr, the temperature is about 400° C. and the treatment time is about 10 seconds.

An $NH_3$ pretreatment may also be performed optionally under the following conditions. The chamber is filled with combined gases of $NH_3$ and $N_2$, the $NH_3$ flow rate is about 9500 sccm, and the $N_2$ flow rate is about 2800 sccm. The chamber pressure is kept at about 4.8 torr. The temperature is about 400° C. and the treatment time is about 10 seconds.

Figure 4:
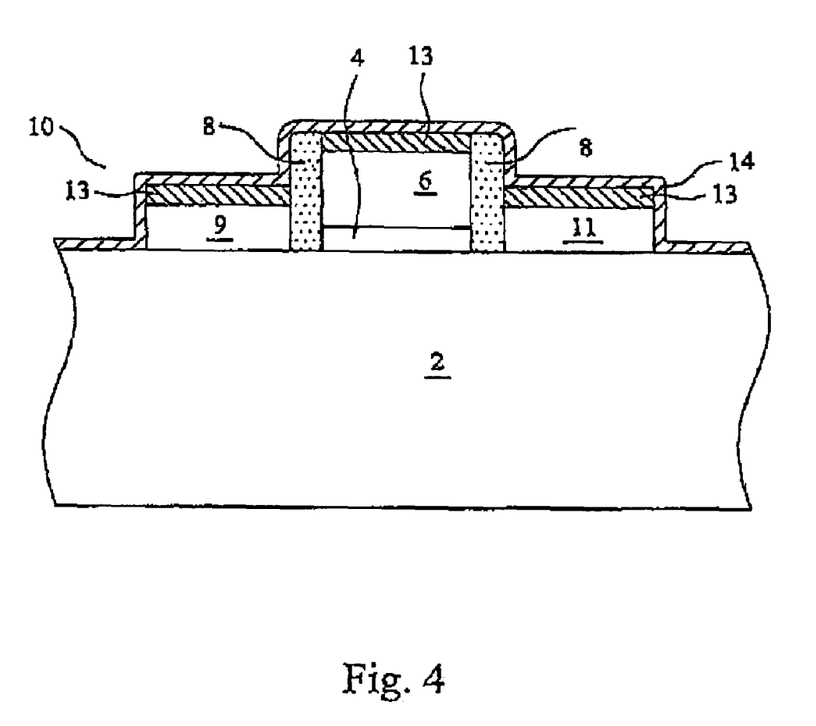

FIG. 4 illustrates the formation of a glue layer 14. To improve adhesion and prevent the CES layer from peeling, a thin glue layer 14 of SiC may optionally be formed on the whole device including source 9 and drain 11 regions, gate spacer 8 and poly 6. The glue layer 14 may be formed by plasma enhanced chemical vapor deposition (PECVD), or other methods such as atomic layer deposition (also known as atomic layer chemical vapor deposition or ALD), low pressure CVD (LPCVD). Preferably, PECVD is used. One example of the deposition conditions is: the precursor is $Si(CH_3)_4$ (also known as 4 MS or tetramethylsilane the flow rate of 4 MS is about 1350 sccm, and the chamber pressure is kept at about 1.6 torr. The temperature is about 400° C.

and the treatment time is about 20 seconds. The thickness of the glue layer 14 is preferably 20 Å to about 50 Å, and more preferably about 20 Å.

Figure 5:
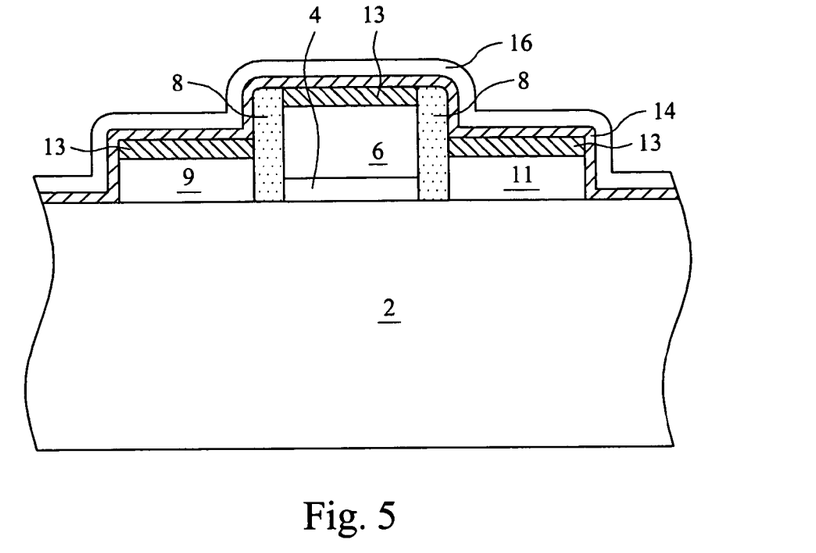

As shown in FIG. 5, a contact etch stop (CES) layer 16 is blanket deposited on glue layer 14. CES layer 16 is preferably formed by PECVD, or other methods such as ALD or LPCVD. In one preferred embodiment of forming the CES layer 16, the material of the CES layer 16 is carbon-doped oxide such as CDO, SiOC, and ODC. CES layer 16 is preferably deposited to a thickness of about 100 Å to about 1000 Å, and more preferably about 300 Å. The forming gas may be any carbon containing precursor, preferably gases comprising 4 MS or $(CH_3)_3SiH$ (also known as 3 MS or trimethylsilane) and carbon dioxide ($CO_2$). In a preferred embodiment where a CDO film is deposited, the gas chamber may be filled with gas precursor of 4 MS and $CO_2$. The flow rate of the gas precursor is about 1060 sccm to about 3860 sccm. The chamber pressure is maintained at about 1.5 torr. The deposition temperature is about 400° C. Under these conditions, a 300 Å to 500 Å CDO film takes about 10 seconds to about 50 seconds to be deposited.

In another preferred embodiment of forming the CES layer 16, the material of CES layer 16 is nitrogen-doped oxide such as NDC and SiCN. The CES layer 16 is preferably deposited to a thickness of about 100 Å to about 1000 Å, and more preferably about 300 Å. The forming gas may be any carbon containing precursor, preferably gases comprising 4MS or $(CH_3)_3SiH$ (also known as 3MS or tetramethylsilane), $NH_3$ and $N_2$. In a preferred embodiment where an NDC film is deposited, the gas chamber may be filled with gas precursor of 4MS, $NH_3$ and $N_2$. The flow rate of the gas precursor is about 1120 sccm to about 1700 sccm. The chamber pressure is maintained at about 3.9 torr. The deposition temperature is about 400° C. Under these conditions, a 300 Å to 500 Å NDC film takes about 10 seconds to about 50 seconds to deposit.

The k value of the SiCO and SiCN based materials is lower than the k value of silicon nitride (typically 7.5 to 8), and the actual k value varies from one process to another. The k value may be adjusted by changing the forming conditions such as the deposition pressure, and the k value of the resulting film typically ranges about 3.0 to about 5.0.

The addition of the CES layer 16 causes inherent stress in the device. It is known that the stress in the device can enhance the carrier mobility, therefore enhancing the device performance. It is also known in the art that the in-plane tensile stress improves the performance of an NMOS device while it degrades the performance of a PMOS device. Therefore, it is desirable that the stress caused by the CES layer 16 be adjustable in order to make use of the beneficial effect of the stress. In the preferred embodiment, the stress may be adjusted by adjusting the deposition conditions such as the deposition temperature. The stress can be adjusted in a range of about –3 Gpa to about 3 Gpa, where the positive value indicates tensile stress and the negative value indicates compressive stress.

Figure 6:
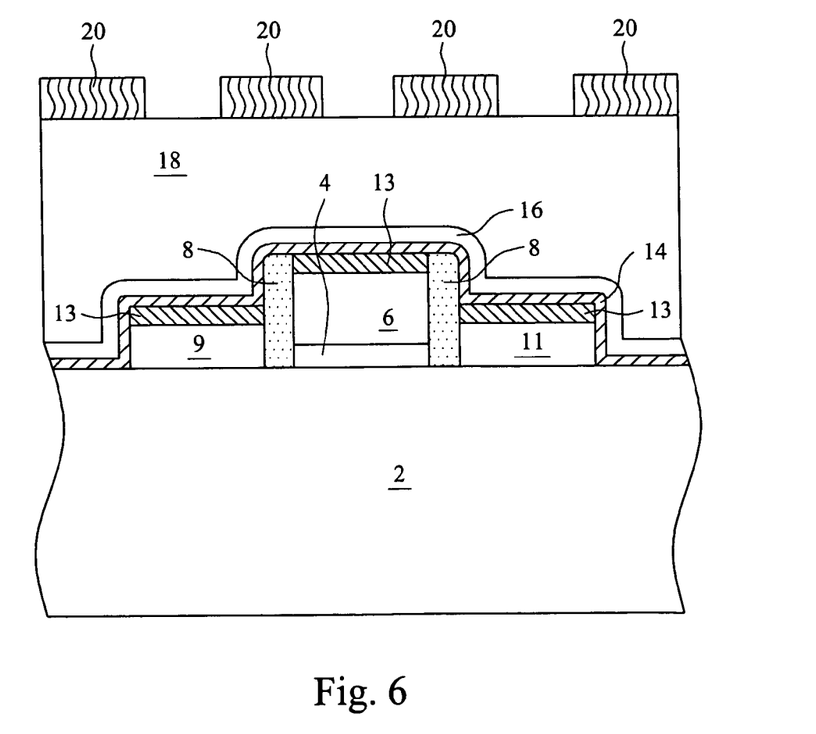

Next, as shown in FIG. 6, an inter-level dielectric (ILD) layer 18, also sometimes known as a pre-metal dielectric (PMD) or an inter-metal dielectric (IMD) layer is deposited on the surface of CES layer 16. In a preferred embodiment, ILD layer 18 is a SiCO or SiCN based material with a k value smaller than about 7.0. More preferably, the k value is smaller than about 4.0. As known in the art, ILD layer 18 provides insulation between the transistor and the overlying metal lines that are formed subsequently. Parasitic capacitors exist between the source/drain and poly and metal lines formed on ILD layer 18, and the parasitic capacitance degrades the device performance. Lowering the k value of the ILD layer 18 makes the parasitic capacitance smaller, therefore improving the device performance. Since a capacitance is proportional to the k value of the dielectric material used, the reduction of the parasitic capacitance may be significant. In other embodiments, ILD layer 18 may also be silicon dioxide deposited using, e.g., Tetraethyl Orthosilicate (TEOS), CVD, PECVD, LPCVD, or other well-known deposition techniques.

Also shown in FIG. 6 is a photo resist material 20 formed and patterned on ILD layer 18 in order to form contact openings 24 to the source and drain regions and the gate. Since ILD layer 18 and CES layer 16 are different materials that can be selectively etched, the etching is performed in two steps. First, the ILD layer 18 is etched stopping at CES layer 16. Second, the CES layer 16 is etched through to expose the underlying layer. Since CES layer 16 is thin compared to ILD layer 18, etching can be controlled more precisely to prevent over etching. Although the materials of CES layer 16 and ILD layer 18 may both be SiCO and SiCN based, they must be different so that selective etching can be performed. In one embodiment, ILD layer 18 is SiCO and CES layer 16 is SiCN, so that when etching ILD layer 18 using $C_4F_6+O_2+CO+Ar$, the etching stops at CES layer 16. CES layer 16 can then be etched using $CH_2F_2+O_2$.

Figure 7:
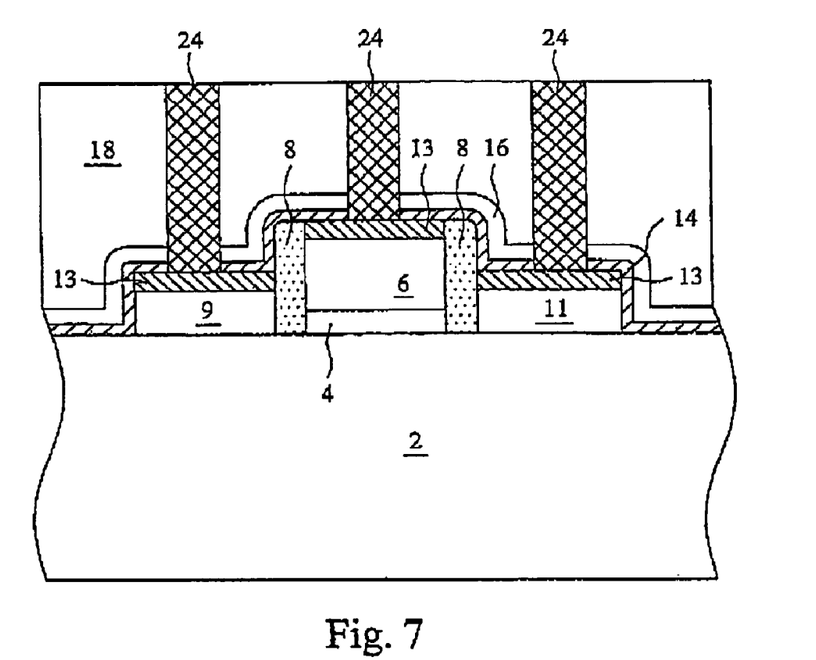

As shown in FIG. 7, contact plugs 24 are formed in the contact openings. Contact plugs 24 may be formed of tungsten, aluminum, copper, or other well-known alternatives. Contact plugs 24 may also be composite structures, including, e.g., barrier and adhesion layers, such as titanium/titanium nitride or tantalum nitride, and other layers as well.

The preferred embodiments of the present invention are compared to the prior art in several aspects such as the k value, parasitic capacitance, deposition rate, contact resistance, sheet resistance, etc. Each of the aspects is discussed briefly below. The prior art devices are formed with similar structures and under similar conditions as the preferred embodiments unless specified otherwise.

Table 1 shows the forming parameters and results of three materials, SiN, ODC and NDC, where SiN is the material used in the prior art, and ODC and NDC are materials used by the preferred embodiments of the present invention. The SiN film is formed in a gas chamber filled with precursor $SiH_4$, $NH_3$ and $N_2$. The deposition temperature is about 480° C. and the chamber pressure is kept at about 3 torr.

TABLE 1

| Material | SiN | ODC | NDC |
| --- | --- | --- | --- |
| Deposition time (Second) | 176 | 54 | 31 |
| Thickness (Å) | 1207 | 1171 | 1104 |
| Deposition rate (Å/Minute) | 411 | 1301 | 2137 |
| k Value | 7.5~8 | 4~5 | 4~5 |
| Deposition temperature (° C.) | 480 | 400 | 400 |

It is noticed that in the preferred embodiments of the present invention, the deposition of the CES layer 16 is faster and may be performed at lower temperatures. The deposition rate of ODC and NDC is about 4 to 5 times the deposition rate of SiN and the deposition temperature of ODC and NDC is 400° C., which is lower than the 480° C. for SiN. The k value of ODC and NDC is in the range of about 4 to 5, much lower than the k value of SiN, which is in the range of about 7.5 to 8.

Figure 8A:
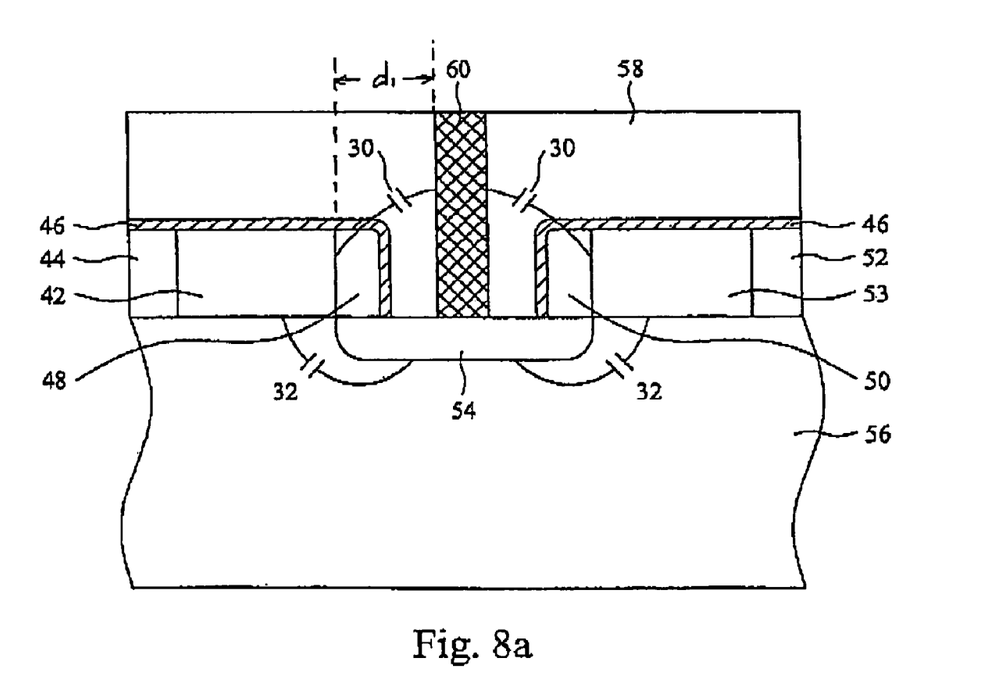
FIGS. 8a and 8b illustrate models for the fringing capacitance.
Figure 8B:
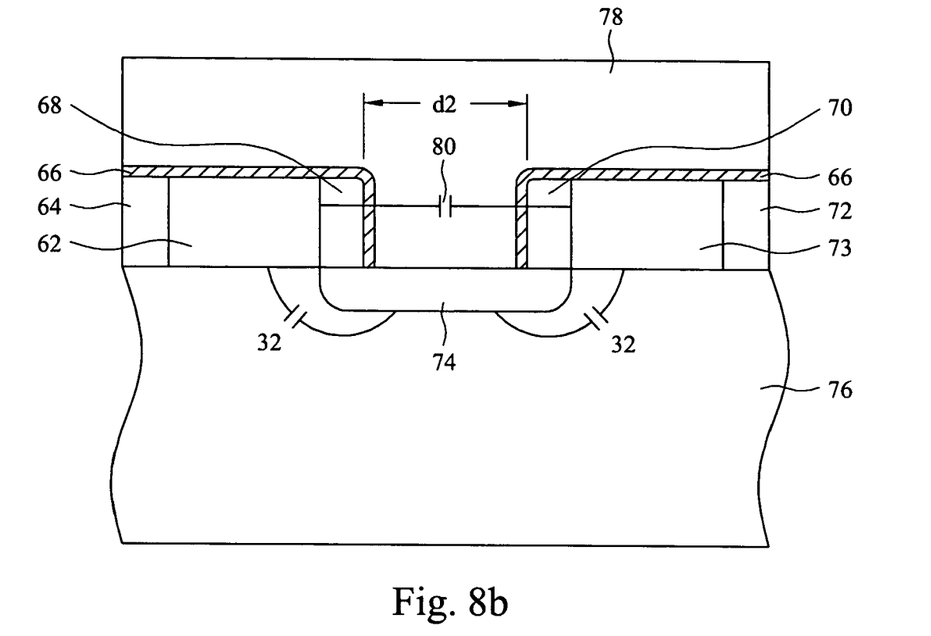

The outer fringing capacitance (parasitic capacitance between poly 6 and source/drain 10) of the device is reduced in the preferred embodiment of the present invention. FIGS.

8a and 8b illustrate the models used to explain the fringing capacitance results. Each of the figures contains spacers of two neighboring MOS devices. In FIG. 8a, 48 and 50 are spacers, and a contact plug 60 is connected to a source or drain 54. Distance $d_1$ is the distance between poly 42 and contact plug 60. Between poly 42 and contact plug 60, there exists fringing capacitance 30. FIG. 8b is similar to FIG. 8a except contact plug 60 is removed. Distance $d_2$ is the distance between poly 62 of one device and poly 73 of another device. Between poly 62 and poly 73, there exists fringing capacitance 80. There are also outer fringing capacitances (the parasitic capacitance between poly and source/drain) 32 between poly and source/drain.

Figure 9:
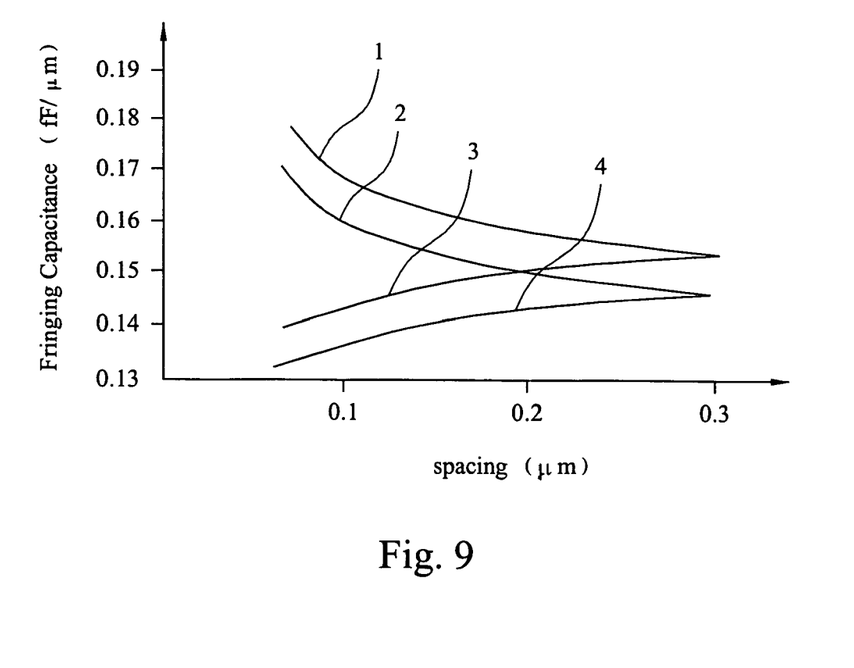
FIG. 9 illustrates the fringing capacitances as a function of the spacing between poly and source/drain/poly.

The capacitances measured are illustrated in FIG. 9, which shows the fringing capacitance as a function of the spacing between source/drain/poly and poly. (The spacing is $d_1$ in FIGS. 8a and $d_2$ in FIG. 8b.) Line 1 and line 2 are the fringing capacitances shown in FIG. 8a, and the fringing capacitance is the combination of capacitances 30 and 32. The k value of CES layer 46, which is formed of SiN, is 7.5 for line 1, and the k value of CES layer 46, which is formed of CDO or NDC, is 4.0 for line 2. Line 3 and line 4 are the fringing capacitances shown in FIG. 8b, and the fringing capacitance is the combination of capacitances 80 and 32. The k value of CES layer 46, which is formed of SiN, is 7.5 for line 3, and the k value of CES layer 46, which is formed of CDO or NDC, is 4.0 for line 4. It is observed that CES layer 46 contributes to the capacitance 30, so that lowering the k value of CES layer 46 reduces the capacitance 30. Therefore, line 2 is lower than line 1 since the k value of CES layer 46 for line 2 is lower. The difference between the capacitances in lines 1 and 2 is about 4% to about 5%. Also, line 4 is lower than line 3 because the k value of CES layer 66 for line 4 is lower than the k value of CES layer 66 for line 3. When the spacing increases, the capacitance of 30 and 80 decreases so that the effect of the CES layer is reduced. At some point, the spacing increases significantly enough that the effects of capacitance 30 and 80 diminish and capacitance 32 becomes the major portion of the fringing capacitance. Therefore, lines 1, 2, 3 and 4 merge.

Figure 10:
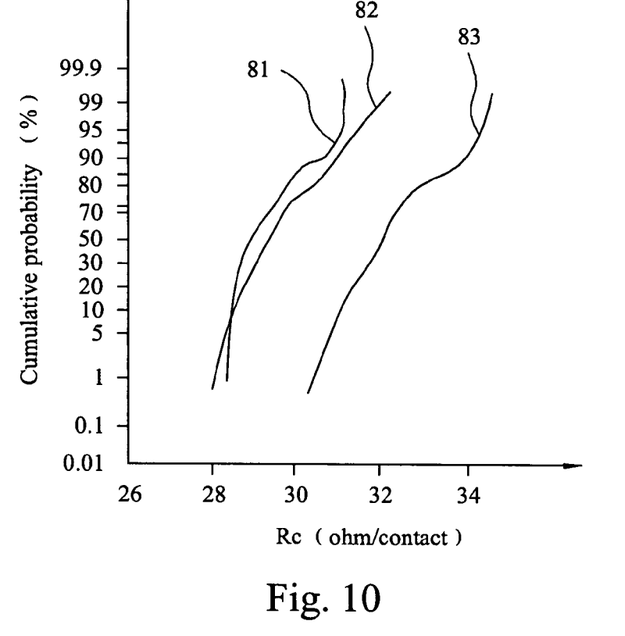
FIG. 10 illustrates the cumulative probability as a function of the contact resistance between an n+ doped source/drain and a contact plug.
Figure 11:
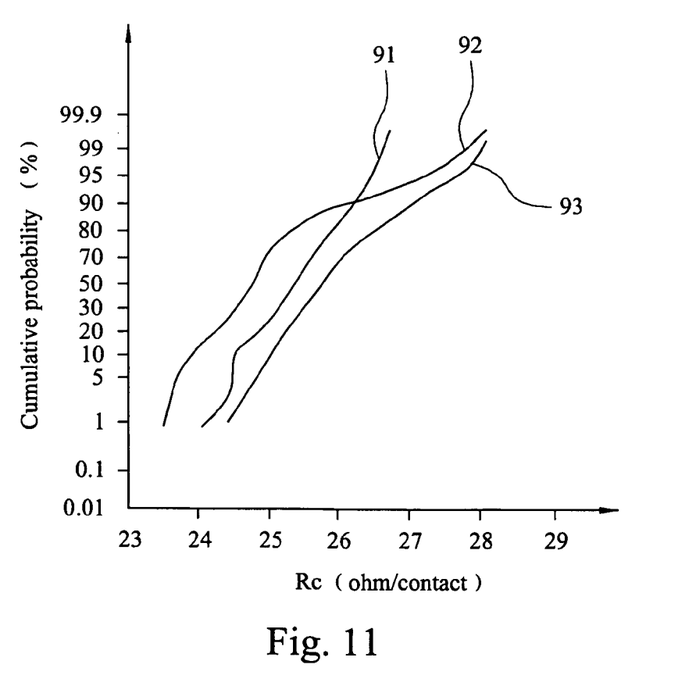
FIG. 11 illustrates the cumulative probability as a function of the contact resistance between a p+ doped source/drain and a contact plug.

It is known in the art that CES layer 16 affects the contact resistance between its underlying layers 6, 10 and the contact plugs 24, possibly because it affects the contact surface characteristics, the contact shape and the over-etch behavior. The contact resistance between the contact plugs 24 and the source/drain 9, 11 are also compared to the prior art. The result is shown in FIGS. 10 and 11. FIG. 10 illustrates the cumulative probability as a function of the contact resistance between a contact plug 24 and an n+ doped source/drain 10. The result is based on 794,475 serially connected contacts. It is noted that the contact resistance with ODC (shown as line 81) or NDC (shown as line 82) as the CES layer 16 is about 10% lower than the contact resistance with SiN (shown as line 83) as the CES layer 16.

FIG. 11 illustrates the cumulative probability as a function of contact resistance between a contact plug 24 and a p+ doped source/drain 9, 11. The result is also based on 794,475 serially connected contacts. The contact resistance with NDC (shown as line 91) and ODC (shown as line 92) as the CES layer 16 is noticeably smaller than the contact resistance of SiN (shown as line 93) as the CES layer 16.

Contact resistance also exists between n+ doped poly silicon and the metal contact. From the test performed based on the average of 794,475 contacts connected in series, it is found that the resistance of NDC and ODC is a little better than the contact resistance of SiN, so that the contact resistance between metal and p+ and n+ poly silicon is at least comparable to the prior art.

The test also shows that when the material of the CES layer 16 is changed from SiN to ODC or NDC, the sheet resistances of the underlying materials are not affected. Measurements have been conducted on n+ source/drain, p+ source/drain, n+ doped poly silicon and p+ doped poly silicon. Their sheet resistances do not change regardless of the materials of the overlaying CES layer.

Other characteristics, such as the threshold voltage and the leakage current of the resulting MOS transistor were also tested. No substantial difference was found between different CES layer materials, such as ODC, NDC and SiN.

Besides the advantages mentioned above, the preferred embodiments of the present invention are fully compatible with current device fabrication processes, and can be made by existing tools and known methods, so that there is no extra cost involved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit device comprising:
    a substrate baying a surface;
    a gate dielectric formed on the surface of the substrate;
    a gate electrode Conned on the gate dielectric;
    a pair of spacers formed along opposite sidewalls of the gate electrode and the gate dielectric;
    source and drain regions formed on opposite sides of the gate electrode;
    a contact etch stop (CES) layer blanket formed on the source and drain regions and the spacers wherein the CES layer is formed of a material selected from the group consisting essentially of a silicon oxycarbide (SiCO) based material and a silicon carbonitride (SiCN) based material;
    an inter-level dielectric (ILD) formed on the CES layer; and
    a conductive plug formed in the inter-level dielectric.

2. The integrated circuit device of claim 1 wherein the spacer material is a material selected from the group consisting essentially of a Silicon, Carbon containing based oxide and a Silicon, Carbon containing based nitride and having a dielectric constant (k value) smaller than about 5.0.

3. The integrated circuit device of claim 1 further comprising a glue layer formed underlying the CES layer.

4. The integrated circuit device of claim 3 wherein the glue layer material is SiC.

5. The integrated circuit device of claim 3 wherein the glue layer has a thickness of about 20 Å to about 50 Å.

6. The integrated circuit device of claim 1 wherein the CES layer has a k value less than about 7.0.

7. The integrated circuit device of claim 1 wherein the thickness of the CES layer is between about 100 Å to about 1000 Å.

8. The integrated circuit device of claim 1 wherein the CES layer has an inherent stress between about −3 CPa and 3 CPa.

9. The integrated circuit device of claim 1 further comprising a step feature comprising a material selected from the group consisting essentially of a Silicon, Carbon containing based oxide and a Silicon, Carbon containing based nitride and having a k value less than about 5.0, wherein the step feature is between two gate polys or between a gate poly and a contact plug.

10. The integrated circuit device of claim 9 wherein the step feature has a height greater than about 300 Å.

11. The integrated circuit device of claim 9 wherein the step feature has an aspect ratio greater than about 2.

12. The integrated circuit device of claim 1 further comprising:
    a second gate electrode formed over a second gate dielectric and having a second pair of spacers formed along opposite sidewalls of the gate electrode and the gate dielectric, wherein one of the spacers of the second pair of spacers is spaced apart from one of said pair of spacers by at most 300 Å.

13. The integrated circuit device of claim 1 wherein the ILD material comprises a material selected from the group consisting essentially of a Silicon, Carbon containing based oxide and a Silicon, Carbon containing based nitride.

14. An integrated circuit device comprising:
    a gate dielectric on a surface of a substrate;
    a gate electrode an the gate dielectric;
    a spacer along a sidewall of the gate electrode and the gate dielectric;
    a source/drain region adjacent the spacer;
    a contact etch stop (CES) layer over the source/drain region and the spacer wherein the CES layer comprises a material selected from the group consisting essentially of a silicon oxycarbide (SiCO) based material and a silicon carbonitride (SiCN) based material;
    an inter-level dielectric (ILD) on the CES layer; and
    a contact plug in the inter-level dielectric.

15. The integrated circuit device of claim 14 further comprising a SiC glue layer underlying the CES layer.

16. The integrated circuit device of claim 14 wherein the CES layer has an inherent stress between about −3 GPa to about 3 GPa.

17. The integrated circuit device of claim 14 wherein the spacer material is a material selected from the group consisting essentially of a SiCO based material and a SiCN based material and wherein the spacer material has a k value less than about 5.0.

18. The integrated circuit device of claim 14 further comprising step features wherein the step features comprise a SiCO or SiGN based material having a k value less than about 5.0.

19. The integrated circuit device of claim 14 further comprising:
    at least two transistor devices having spacers wherein the spacing between the spacer of the first transistor device and the spacer of the second transistor device is smaller than about 300 Å.

* * * * *

UNITED STATES PATENT AND TRADEMARK OFFICE
CERTIFICATE OF CORRECTION

PATENT NO. : 7,115,974 B2
APPLICATION NO. : 10/895514
DATED : October 3, 2006
INVENTOR(S) : Wu et al.

It is certified that error appears in the above-identified patent and that said Letters Patent is hereby corrected as shown below:

Column 8, line 40; delete "baying" insert --having--
Column 8, line 42; delete "Conned" insert --formed--
Column 9, line 7; delete "CPa" insert --GPa--
Column 9, line 8; delete "CPa" insert --GPa--
Column 10, line 1; delete "an" insert --on--

Signed and Sealed this

Twenty-sixth Day of December, 2006

JON W. DUDAS
*Director of the United States Patent and Trademark Office*